United States Patent [19]

Wong

[11] Patent Number: 5,741,432

[45] Date of Patent: Apr. 21, 1998

[54] STABILIZED NITRIC ACID COMPOSITIONS

[75] Inventor: Kwee C. Wong, Londonderry, N.H.

[73] Assignee: The Dexter Corporation, Industry, Calif.

[21] Appl. No.: 373,594

[22] Filed: Jan. 17, 1995

[51] Int. Cl.$^6$ .................................. C23F 1/16; C23F 1/18
[52] U.S. Cl. .................... 216/108; 216/106; 252/79.2; 423/265; 423/390.1
[58] Field of Search .................. 423/265, 390.1, 423/DIG. 1; 216/100, 106, 108; 252/79.2

[56] References Cited

U.S. PATENT DOCUMENTS

| | | | |
|---|---|---|---|
| 2,769,690 | 11/1956 | Mahan et al. | 423/390.1 |
| 3,019,081 | 1/1962 | Doss et al. | 423/390.1 |
| 3,113,836 | 12/1963 | Blackwell | 423/390.1 |
| 3,841,905 | 10/1974 | Dixon, III. | |
| 3,926,699 | 12/1975 | Dixon. | |
| 3,990,982 | 11/1976 | Dixon. | |
| 4,297,257 | 10/1981 | Elias et al.. | |
| 4,306,933 | 12/1981 | Da Fonte, Jr.. | |
| 4,374,744 | 2/1983 | Kawanabe et al.. | |
| 4,410,396 | 10/1983 | Somers et al.. | |
| 4,439,338 | 3/1984 | Tomaiuolo et al.. | |
| 4,459,216 | 7/1984 | Nakazato et al. | 216/106 |
| 4,636,282 | 1/1987 | Wong | 216/106 |
| 4,713,144 | 12/1987 | Schiller. | |
| 4,921,571 | 5/1990 | Kukanskis et al. | 216/108 |
| 4,938,838 | 7/1990 | Dalin et al. | 216/106 |
| 4,957,653 | 9/1990 | Cordani. | |
| 4,964,920 | 10/1990 | Jackson et al.. | |
| 5,223,087 | 6/1993 | Itani et al. | 216/108 |
| 5,234,542 | 8/1993 | Cordani | 216/108 |
| 5,244,539 | 9/1993 | McGrath et al.. | |

OTHER PUBLICATIONS

Therald Moeller, "An Introduction to Equilibrium and Solution Chemistry," *Qualitative Analysis*, 1st Ed., 1958, New York.

Daniel J. Newman, "Nitric Acid," *Encyclopedia of Chemical Technology*, 3d. Ed., vol. 15.

*Primary Examiner*—Wayne Langel
*Attorney, Agent, or Firm*—Fish & Richardson P.C.

[57] ABSTRACT

A composition that includes an aqueous solution of nitric acid and an additive having the formula

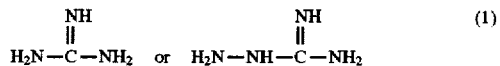

or a salt thereof, in an amount sufficient to improve the oxidative stability of the aqueous nitric acid solution relative to the oxidative stability of that aqueous solution in the absence of the additive.

1 Claim, No Drawings

STABILIZED NITRIC ACID COMPOSITIONS

BACKGROUND OF THE INVENTION

This application relates to stabilizing aqueous nitric acid compositions.

Nitric acid is a major industrial chemical. Aqueous nitric acid solutions are often used in the manufacture of printed circuit boards as etchants to remove tin and lead-tin alloys from copper substrates. One problem with nitric acid solutions, however, is that the nitric acid has a tendency to decompose in the presence of contaminants such as metals, causing release of nitrogen oxides in the form of brown fumes.

SUMMARY OF THE INVENTION

In a first aspect, the invention features a composition that includes an aqueous solution of nitric acid and an additive having the formula

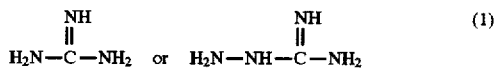

or a salt thereof. The additive is present in an amount sufficient to improve the oxidative stability of the aqueous solution of nitric acid relative to the oxidative stability of the aqueous solution in the absence of the additive.

In preferred embodiments, the composition includes between about 0.01 and about 5% by weight of the additive. Preferred additives include aminoguanidine, guanidine, and salts thereof (e.g., bicarbonate, chloride, nitrate, and sulfate salts).

In a second aspect, the invention features a method of improving the oxidative stability of an aqueous solution of nitric acid that includes combining the aqueous solution with one or more of the above-described additives.

In a third aspect, the invention features a method of stripping unwanted material from a metal substrate that includes treating the substrate with a composition that includes an aqueous solution of nitric acid and one or more of the above-described additives.

The invention provides aqueous nitric acid solutions which, by virtue of incorporating a stabilizing additive described above, exhibit improved oxidative stability. The additive, however, neither interferes with, nor retards, the stripping action of the composition. Moreover, the additive does not harm the exposed surface of the metal substrate (e.g., a copper substrate) to which the composition is applied for the purpose of stripping unwanted material such as tin and tin-lead alloys. In addition, nitric acid solutions containing the additive are readily disposed of because the additive does not chelate metals such as lead and copper during waste water treatment (causing such metals to be sequestered, rather than precipitated).

Other features and advantages of the invention will be apparent from the following description of the preferred embodiments thereof, and from the claims.

DESCRIPTION OF THE PREFERRED EMBODIMENTS

Preferred embodiments of the invention will be described by way of the following examples.

EXAMPLE 1

200 mL of a stripping composition having the following composition was prepared (all amounts in weight percent):

| | |
|---|---|
| 70% Nitric Acid | 30.0% |
| 48% Fluoroboric Acid | 5.5% |
| Aminoguanidine bicarbonate | 5.0% |
| Water | Balance |

The resulting solution was applied to a copper coupon measuring 2 in.×2 in. containing a 0.03 mil thick lead-tin solder coating to strip the solder coating. After several seconds, effervescence occurred and lasted for approximately 2–3 minutes, during which time the solder layer was stripped, leaving a gray tin-copper intermetallic layer. During the process, no evolution of brown fume characteristic of nitric acid decomposition was observed.

Comparative Example 1

The procedure of Example 1 was followed except that the aminoguanidine stabilizer was not added to the nitric acid solution. During the stripping process, the evolution of brown fumes was observed, indicating that nitric acid decomposition was occurring. In addition, the copper substrate exhibited a blotchy appearance, demonstrating that the surface had been oxidized as a result of nitric acid decomposition (which destroyed the intermetallic layer).

EXAMPLE 2

The procedure of Example 1 was followed except that 1 weight percent guanidine bicarbonate was used as the stabilizer. The results were similar to those observed in the case of Example 1.

EXAMPLE 3

The procedure of Example 1 was followed except that 0.5 weight percent aminoguanidine bicarbonate was used as the stabilizer. The results were similar to those observed in the case of Example 1.

EXAMPLE 4

The procedure of Example 1 was followed except that 200 mL of a stripping composition having the following composition was used (all amounts in weight percent):

| | |
|---|---|
| 70% Nitric Acid | 30.0% |
| 45% Ferric Nitrate Solution | 15.0% |
| Aminoguanidine bicarbonate | 0.1% |
| Water | Balance |

Within 60 seconds, all the solder had been removed, exposing the copper substrate. During the process, no brown fumes were observed.

EXAMPLE 5

The procedure of Example 4 was followed except that 0.1 weight percent guanidine bicarbonate was used as the stabilizer. The results were similar to those observed in the case of Example 1.

EXAMPLE 6

The procedure of Example 4 was followed except that 1.0 weight percent aminoguanidine bicarbonate was used as the stabilizer. The results were similar to those observed in the case of Example 4.

EXAMPLE 7

The procedure of Example 4 was followed except that 1.0% guanidine bicarbonate was used as the stabilizer. The results were similar to those observed in the case of Example 4.

EXAMPLE 8

A basic stripping solution having the following composition was prepared (all amounts in weight percent):

| | |
|---|---|
| 70% Nitric Acid | 30.0% |
| 45% Ferric Nitrate Solution | 15.0% |
| Cobratec 99* | 1.5% |
| Hydrochloric Acid | 1.0% |
| Water | Balance |

*Trade name for benzotriazole.

Using this as the basic solution, a series of solutions containing from 0.01 to 5.0 weight percent aminoguanidine bicarbonate were prepared. The aminoguanidine bicarbonate was soluble in the solution even at 5.0 weight percent. The solutions were tested following the procedure of Example 4 with similar results.

Other embodiments are within the following claims.

What is claimed is:

1. A method of stripping unwanted material from a metal substrate comprising treating said substrate with a composition comprising an aqueous solution of nitric acid and an additive having the formula

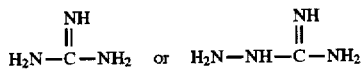

or a salt thereof, said additive being present in an amount sufficient to improve the oxidative stability of said aqueous solution of nitric acid relative to the oxidative stability of said aqueous solution in the absence of said additive, and said composition being essentially free of hydrogen peroxide.

* * * * *